(12) United States Patent
Dixon

(10) Patent No.: US 7,853,845 B2
(45) Date of Patent: Dec. 14, 2010

(54) CIRCUIT AND METHOD FOR INTEGRATED CIRCUIT CONFIGURATION

(75) Inventor: Scott Dixon, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 659 days.

(21) Appl. No.: 11/845,662

(22) Filed: Aug. 27, 2007

(65) Prior Publication Data

US 2009/0058459 A1    Mar. 5, 2009

(51) Int. Cl.
*G01R 31/28* (2006.01)
*G01R 31/30* (2006.01)
*G01R 35/00* (2006.01)

(52) U.S. Cl. .................... 714/724; 714/741; 714/745; 702/85

(58) Field of Classification Search ............. 714/779, 714/724, 799, 822, 819, 814, 798, 731, 709, 714/741, 742, 744, 738; 703/13, 14, 16, 703/19, 22; 702/85, 89, 97
See application file for complete search history.

(56) References Cited

U.S. PATENT DOCUMENTS

| | | | |
|---|---|---|---|
| 5,361,001 A | | 11/1994 | Stolfa |
| 5,651,014 A | * | 7/1997 | Kobayashi .................. 714/744 |
| 6,070,256 A | * | 5/2000 | Wu et al. .................... 714/718 |
| 6,338,032 B1 | | 1/2002 | Chen |
| 6,667,918 B2 | * | 12/2003 | Leader et al. ............... 365/201 |
| 6,927,624 B2 | | 8/2005 | Ivanov et al. |
| 6,993,467 B2 | | 1/2006 | Gavrila et al. |
| 2006/0276986 A1 | | 12/2006 | Anderson et al. |

* cited by examiner

*Primary Examiner*—Christine T Tu
(74) *Attorney, Agent, or Firm*—Schwegman, Lundberg & Woessner, P.A.

(57) ABSTRACT

An auto-trim circuit that sets trim bits for an integrated circuit includes a coarse bit calibration circuit for determining a first portion of the trim bits as a set of coarse bits, and a fine bit calibration circuit for determining a second portion of the trim bits as a set of fine bits wherein said fine bits.

24 Claims, 3 Drawing Sheets

US 7,853,845 B2

CIRCUIT AND METHOD FOR INTEGRATED CIRCUIT CONFIGURATION

FIELD OF THE INVENTION

The present invention relates to a circuit for determining trim bits in an integrated circuit.

PRIOR ART

An integrated circuit has a desired operating point that is in a range of parameters for operation of a circuit. To reach this desired point of operation, manufacturers must adjust certain bits to adjust the signals provided to various components of the system. These adjusted bits are commonly referred to as trim bits.

In the past, the setting of the trim bits was performed in the following manner. First, the manufacturer designs a test program. The test program sets the trim bits, applies the trim bits to the circuit, and measures the results. The test program analyzes the results and modifies the trim bits based upon the results. This process is repeated until the optimum set of bits for causing the circuit to perform at the desired operating point is found. The optimum set of bits is written to a register for use during operation of the circuit. This method adds greatly to time and cost of designing an integrated circuit.

There have been several attempts to generate a process for setting the trim bits without having to write a new test program for every circuit designed. However, most of the prior art solutions simply try each combination of trim bits until the desired results of circuit performance are measured. There are two main drawbacks to this approach. First, this procedure is very time consuming and the process is intensive. In the worst case for n trim bits, the procedure takes $2^n$ tests to find the proper trim bits. Second, this procedure may not find the optimum bit set. Instead, this procedure may find a set of trim bits that satisfy the parameters but are not the optimum set of trim bits.

SUMMARY OF THE INVENTION

The above and other problems are solved and an advance in the art is made by an auto-trim circuit in accordance with this invention. A first advantage of an auto-trim circuit is that the circuit reduces the need for designing a separate test for each circuit design. This reduces both expense and time needed to design a new circuit. A second advantage of an auto trim circuit is that time and computations needed to find the trim bits is greatly reduced.

BRIEF DESCRIPTION OF THE DRAWINGS

The above and other features and advantages of this invention are described in the following detailed description and are shown in the following drawings.

DETAILED DESCRIPTION

Figure 1:
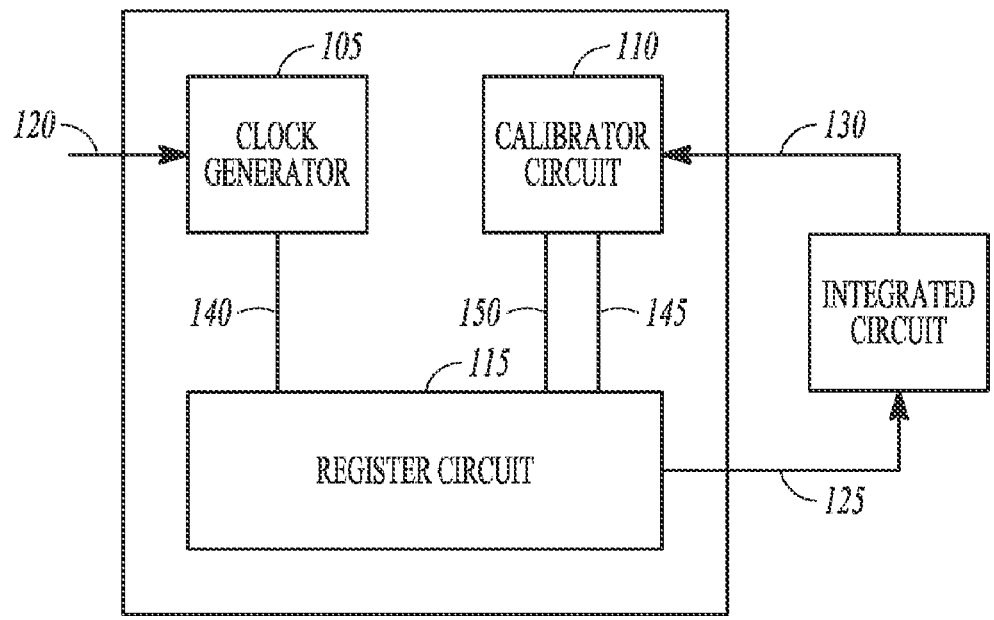
FIG. 1 illustrating a block diagram of an auto-trim circuit in accordance with a first exemplary embodiment of this invention.

This invention relates to a circuit and process for setting trim bits in an integrated circuit. The advantages and features of this invention are described below. Where appropriate, reference numerals of a component shown in different figures are the same.

This invention relates to a process and/or circuits that sets trim bits in an integrated circuit. This process sets the trim bits in to parts. In accordance with this invention, the process and/or circuit first determines the value of coarse bits. For purposes of this discussion coarse bits are the uppermost bits of the trim bits. However, one skilled in the art will recognize that the coarse bits may be the lower portion of trim bits, or certain bits in the trim bits selected for any reason a designer of such system may require. The process and/or circuit then determines the fine bits in accordance with this invention. For purposes of this discussion, the fine bits are the lower bits of the trim bits. However, one skilled in the art will recognize that the fine bits may also be the upper bits or any number of bits chosen by a designer for any reason.

FIG. 1—An Exemplary Embodiment of an Auto-Trim Circuit

FIG. 1 illustrates a block diagram of an auto-trim circuit 100 in accordance with one exemplary embodiment of this invention. Auto-trim circuit 100 includes sample clock generator 105, calibration circuit 110, and register circuit 115. Auto trim circuit 100 receives system clock signals via path 125. Path 125 connects the auto-trim circuit to the trim input for the integrated circuit (Not Shown). Path 130 connects the output to the integrated circuit to auto-trim circuit 100.

Sample clock generator 105 receives the system clock signals via path 120. The received clock signals are then divided into smaller signals to generate a sample clock of a lower frequency. In an exemplary embodiment, the system clock signal is divided by eight to generate eight sample clock signals from each system clock signal. Sample clock generator 105 then transmits the sample clock signals to calibration circuit 110 via path 135 and to register circuit 115 via path 140.

Calibration circuit 110 receives data from the integrated circuit via path 130. Calibration circuit 110 samples data from the integrated circuits at the rate of the sample clock. During a first part of the operation, calibration circuit 110 determines whether the test criteria meet the requirement for the coarse bits. If the criteria are met, a coarse trim signal is applied to path 150 and transmitted to register circuit 115. After the coarse bits are set, the same procedures are used for the fine bits by calibration circuit 110. If the criteria are met the criteria were met above, fine trim signal is applied to path 145 and transmitted to register circuit 115.

In an exemplary embodiment, the above procedures are completed in the following manner. Reference clock generator 105 generates a lower frequency clock from the system clock of the Integrated Circuit (Not shown). This local clock is applied to calibration circuit 110, and register circuit 115. The calibration circuit 110 then steps through the different codes that charge a capacitor in Integrated Circuit (Not shown) at a controlled ramp rate. When the charge of the capacitor reaches a level of a reference voltage, a sample signal is applied to the Integrated Circuit. If the reference clock signal does not toggle before the sample signal is applied to Integrated Circuit (Not shown), the trim code is adjusted and the test is repeated. Once the reference clock toggle before the sample signal is generated the coarse bits are set. The same test is repeated for the fine bits.

Register circuit 115 receives sample clock signals via path 140 from sample clock generator 105, receives a coarse trim signal via path 150, and receives a fine trim signal via path 145. Register circuit 115 applies test bits to the integrated circuit via path 125 on each clock cycle. Then register circuit 115 monitors paths 145 and 150. When the coarse trim signal is detected, register circuit 115 stores the coarse bits in a trim register in the circuit. The process is then repeated for the fine bits. When the fine bit signal is received the fines bits applied to integrated circuit are stored to the register. Register circuit 115 then asserts a trim ready signal and the trim bits stored in the register are applied to integrated circuits as trim bits.

Figure 2:
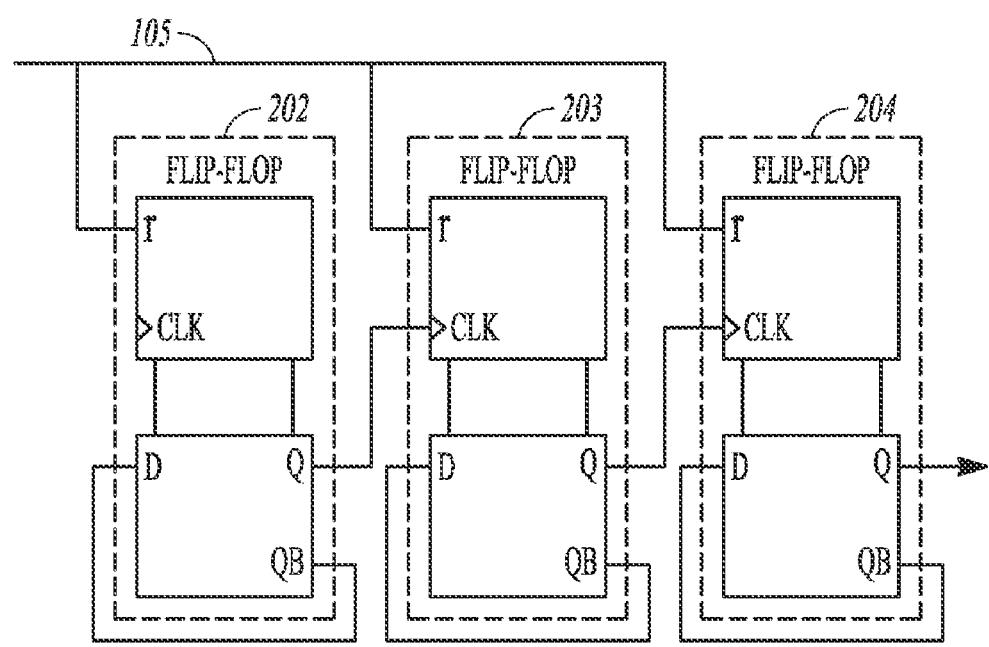
FIG. 2 illustrating a block diagram of a sample clock generating circuit in accordance with the first exemplary embodiment of this invention.

FIG. 2—An Exemplary Embodiment of a Sample Clock Generator

FIG. 2 illustrates an exemplary embodiment of sample clock generator 105 of auto-trim circuit 100. Sample clock generate 105 includes three D flip-flops 202-204. D flip-flops 202-204 are shown in two parts representing the signal path and the control path within the dashed lines. Each D flip-flop has three input and two output signals. The inputs include a data pin, a clock pin and a reset pin. The outputs include a Q pin and Qb pin where the output of the Qb pin is the complement of the output of the Q pin. In a D flip-flop, the data from the data pin is captured and output on the Q pin with the complement being output on the Qb pin when the clock signal transitions from low to high.

In FIG. 2, D flip-flops 202-204 are configured in a way that the Qb output of a preceding D flip-flop is connected to the data input of the following D flip-flop. This divides the clock signal by two in every D flip-flop. For purposes of this discussion, dividing the clock signal by two means that one transition on the Q output occurs for every two transitions of the clock signal. This configuration provides a counter where the final output of third D flip-flop 204 is high with a count of eight system clocks. A trim enable signal is applied to the reset pins of each of the D flip-flops to hold the reset pins low. This causes all of the Q outputs to go low. Then, on each positive clock edge, a countdown is started.

Figure 3:
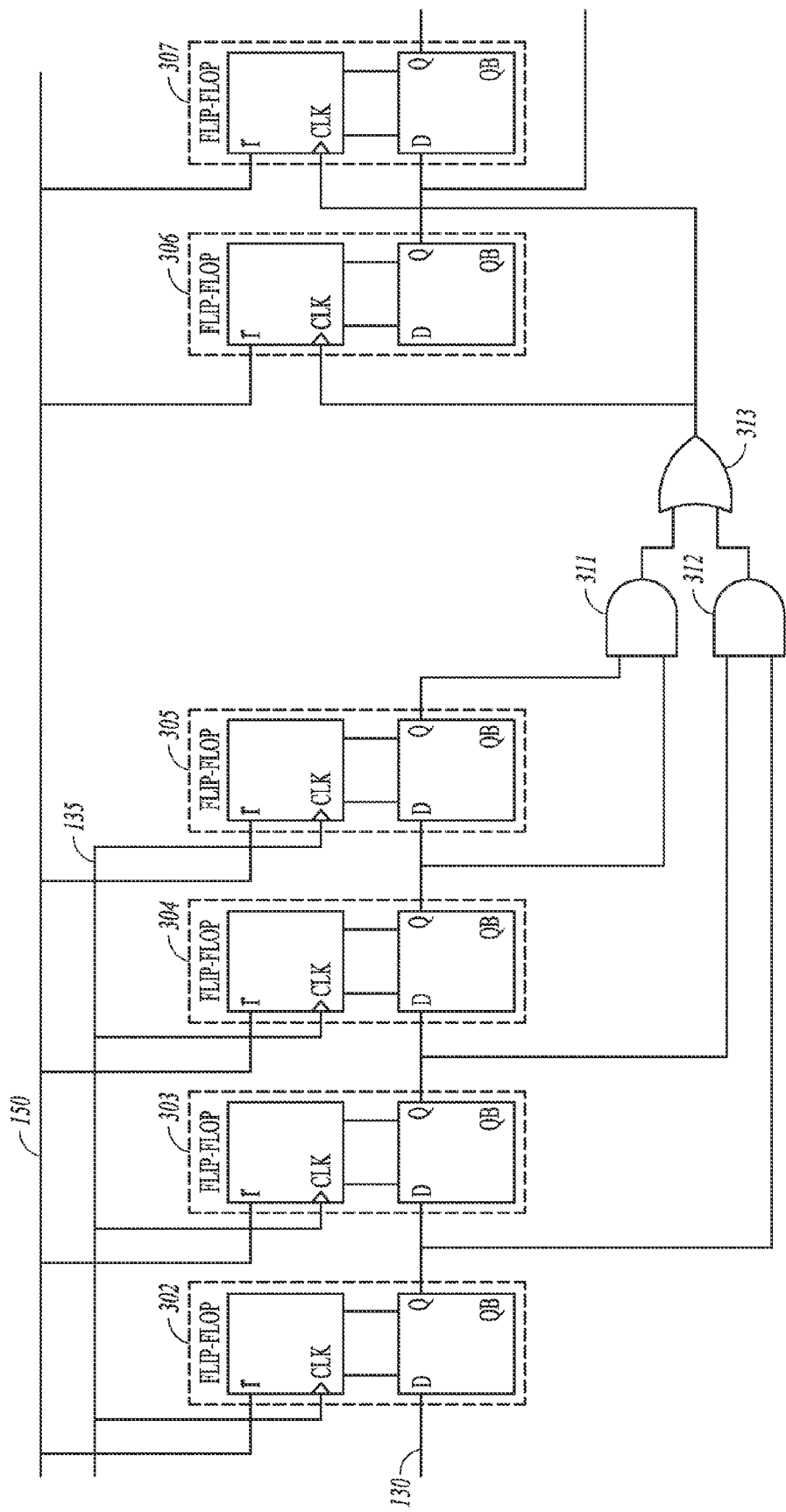
FIG. 3 illustrating a block diagram of a trim calibration circuit in accordance with the first exemplary embodiment of this invention.

FIG. 3—An Exemplary Embodiment of a Calibration Circuit

FIG. 3 illustrates an exemplary embodiment of calibration circuit 110 of auto-trim circuit 100. Calibration circuit 110 receives the local clock signal from sample clock generator 105. Auto calibration circuit 110 receives the sample clock signals via path 135, trim enable signals via path 150, and a calibration signal via path 130. Auto-trim circuit 110 includes six D flip-flops 302-307, NAND gates 311-312, and NOR gate 313. First D flip-flop 302 receives the sample clock signals via path 135 and the error signal via path 130 and a trim enable signal via path 150. When a trim enable signal is received via path 150, first D flip-flop 302 latches the received error signal when the sample clock toggles.

The output of first D flip-flop 302 is applied to data input of second flip-flop 303 via path 320. Second D flip-flop 303 also receives a trim enable signal via path 150 and the sample clock via path 135. When the sample clock toggles, second D flip-flop 303 latches the received signal from first D flip-flop 302. The output of second D flip-flop 303 is applied to the data input of third D flip-flop 304 via path 325. Third D flip-flop 304 also receives a trim enable signal via path 150 and the sample clock via path 135. When the sample clock toggles, third D flip-flop 304 latches the received signal from second D flip-flop 303.

The output of third D flip-flop 304 is applied to the data input of fourth D flip-flop 305 via path 320. Fourth D flip-flop 305 also receives a trim enable signal via path 150 and the sample clock via path 135. When the sample clock toggles, fourth D flip-flop 305 latches the received signal from third D flip-flop 304.

The outputs of first and second D flip-flops 302 and 303 are applied to NAND gate 311 and the outputs of third and fourth D flip-flops are applied to NAND gate 312. The outputs of NAND gates 311 and 312 are applied to NOR gate 315 which applies an output to fifth D flip-flop and sixth D flip-flop 306 and 307. The output of OR gate 312 causes fifth D flip-flop 306 to latch the trim enable signal received via path 308 when asserted. Fifth D flip-flop 306 then outputs a trim enable signal via path 150 and applies an output to sixth D flip-flop 307. Sixth D flip-flop 307 latches the output signal of fifth D flip flop 306 when the output of OR gate 315 is asserted.

In FIG. 3, calibration circuit 110 has six conventional D flip-flops, each having a data input, clock input and reset input. The D flip-flops also have a Q output and a Qb output. In calibration circuit 110, the q outputs of the D flip-flops become latched error conditions. Thus, when four consecutive error conditions occur, the trim bits have been determined. On each of the local clocks positive edges, the error condition from a D flip-flop is latched in the D flip-flop and transmitted to the data input of the next D flip-flop in the chain. On the next clock edge, data on both D flip-flops is latched. Once the error condition has stayed high through four consecutive clock cycles, the four inputs to the two NAND gates are high. This makes the output of the NAND get low. The low from the outputs of the two NAND gates are applied to a NOR gate. The output from the NOR gate is high which triggers the latching of the trim bits. The first time through the process latches the coarse bits and a second time through the process latches the fine bits.

Figure 4:
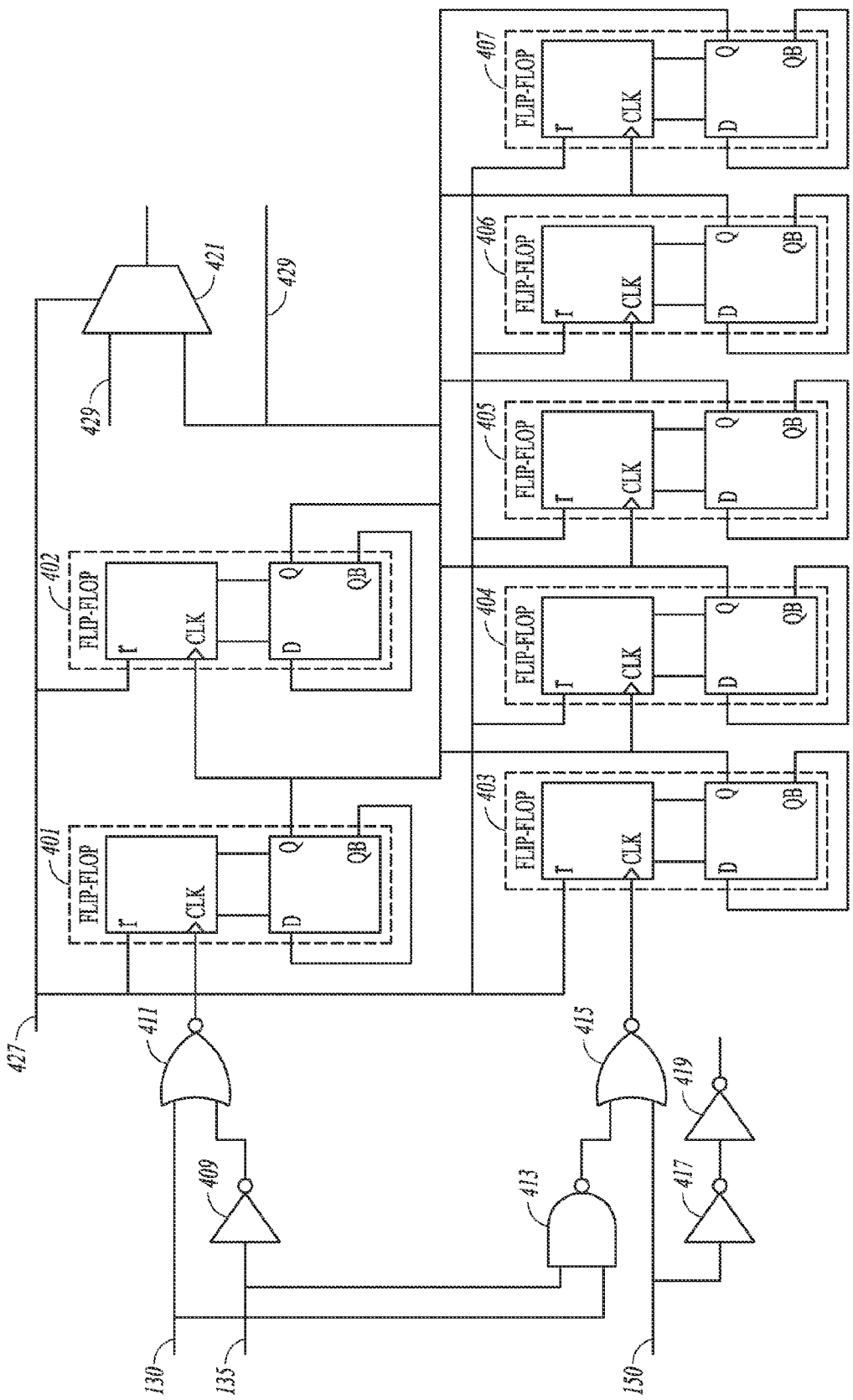
FIG. 4 illustrating a block diagram of a register circuit in accordance with the first exemplary embodiment of this invention.

FIG. 4—An Exemplary Embodiment of a Register Circuit

FIG. 4 illustrates a block diagram of register circuit 115 of auto-trim circuit 110. Register circuit 115 latches the trim codes as the codes are determined. At the beginning the trim codes are set and after eight sample clock cycles, the code is modified by one bit. When four consecutive error conditions are detected by calibration circuit 110, a trim ready signal is received by register circuit 115. The trim code is now set and register circuit 115 stores the trim code.

Register circuit 115 includes D flip-flops 401-407, also shown in two-part form within the dashed lines. Each D flip-flop latches one of the trim bits. In this case, D flip-flops 401 and 402 latch the coarse bits and D flip-flops 403-407 latch the fine bits. The D flip-flops are configured so that the Q output from a prior D flip-flop is connected to the data input of a subsequent D flip-flop. The coarse bit D flip-flops are configured as a two-bit counter. One skilled in the art will recognize more D flip-flops may be added to increase the number of coarse bits. The fine bit D flip-flops are configured as a five bit counter. One skilled in the art will recognize more D flip-flops may be added to increase the number of coarse and/or fine bits.

The clock signals to both the fine and coarse bits are gated through gate logic including inverter 409 NOR gates 411, NAND gate 413, NOR gate 415 and inverters 417 and 419. Trim coarse signal at line 130 to NOR gate 411. The reference clock is supplied on line 135. Trim fine signal is applied on line 150 to NOR gate 415 and inverter 417. The reference clock modifies the counter in each of the D flip-flops until the trim signal is received. First, the trim coarse signal on line 130 goes low. This enables NOR gate 411 and disables NAND gate 413. This latches the coarse bits in D flip-flops 401 and 402. After the coarse bits go high, the process is started for the fine bits by raising the level on line 130 to a high level to disable NOR gate 411 and enable NAND gate 413. When the fine bit detection starts, the clock signals are no longer applied to the coarse D flip-flops. This latches the coarse bits in the coarse D flip-flops and the process is repeated for the fine bits. Fine bit D flip-flops 403-407 are latched with the values of the fine trim bits.

Once the fine bits go high, a trim ready signal is generated from line 150 and buffered at the output of inverter 419. The trim ready signal is then applied to the Integrated Circuit indicating that value on the trim bits bus 423 connected to Q outputs of D flip-flops 401-407 is ready for use.

Multiplexer 421 has one set of data inputs coupled to trim bits bus 423 and another set of data inputs on lines 425 that may be sourced from fuses or non-volatile memory. The second set of data inputs may be programmed and used once the trim configuration is set. The control input of multiplexer 421 at line 427 is used to select between the sets of data inputs as is known in the art. The trim bit configuration may be read out from a finger 429 of trim bits bus 423 that bypasses multiplexer 421.

The above is a description of one exemplary embodiment of an auto-trim circuit in accordance with this invention. It is expected that those skilled in the art can and will design alternative embodiments that fall within the scope of this invention as set forth in the following claims either literally or through the Doctrine of Equivalents.

What is claimed is:

1. A method for setting trim bits in an integrated circuit comprising:
    determining a set of coarse bits wherein said coarse bits are a first portion of said trim bits;
    determining a set of fine bits wherein said fine bits are a second portion of said trim bits; and
    storing said set of coarse bits and said set of fine bits in a register for use in said integrated circuit.

2. The method of claim 1 wherein said step of determining said set of coarse bits comprises:
    receiving a system clock signal; and
    dividing said system clock signal into sample clock signals wherein each of said sample clock signals have a lower frequency than said system clock signal.

3. The method of claim 1 wherein said step of determining said coarse bits comprises:
    selecting a set of test bits that act as said coarse bits;
    applying said set of test bits to said circuit on each sample clock signal;
    reading output of said circuit on each sample clock signal;
    determining whether said output meet a criteria for each sample clock; and
    setting said coarse bits responsive to a determination that said output meets said criteria a predetermined number of said sample clock signals by asserting a coarse trim signal responsive to said determination that output meets said criteria said predetermined number of times.

4. The method of claim 3 wherein said step of setting said coarse bits comprises:
    receiving said coarse trim signal in a register circuit; and
    storing said test bits as coarse bits responsive to receiving said coarse trim signal.

5. The method of claim 4 wherein said step of determining said fine bits comprises:
    selecting a set of test bits that act as said fine bits;
    applying said set of test bits to said circuit on each sample clock signal;
    reading output of said circuit on each sample clock signal;
    determining whether said output meet a criteria for each sample clock; and
    setting said fine bits responsive to a determination that said output meets said criteria a predetermined number of said sample clock signals by asserting a fine trim signal responsive to said determination that said output meets said criteria said predetermined number of times.

6. The method of claim 5 wherein said step of setting said fine bits comprises:
    receiving said fine trim signal; and
    storing said test bits as said fine bits responsive to receiving said fine trim signal.

7. The method of claim 1 wherein said step of determining said set of fine bits comprises:
    receiving a system clock signal; and
    dividing said system clock signal into sample clock signals wherein said sample clock signals have a lower frequency than said system clock signals signal.

8. A circuit for setting trim bits in an integrated circuit comprising:
    a coarse bit calibration circuit for determining a set of coarse bits wherein said coarse bits are a first portion of said trim bits; and
    a fine bit calibration circuit for determining a set of fine bits wherein said fine bits are a second portion of said trim bits.

9. The circuit of claim 8 further comprising:
    a trim bit register circuit for storing said set of coarse bits and said set of fine bits for use in said integrated circuit.

10. The circuit of claim 9 wherein said trim bit register circuit comprises:
    an input for receiving a coarse trim signal from said coarse calibration circuit; and
    circuitry configured to store said first portion of said trim bits as coarse bits responsive to receiving said coarse trim signal.

11. The circuit of claim 9 wherein said fine bit calibration circuit comprises:
    circuitry configured to select a set of test bits that act as said fine bits;
    circuitry configured to apply said set of test bits to said integrated circuit on each sample clock signal;
    circuitry configured to read output of said integrated circuit on each sample clock signal; and
    circuitry configured to determine whether said output meet a criteria for each sample clock.

12. The circuit of claim 9 wherein said trim bit register circuit comprises:
    an input for receiving a fine trim signal from said fine calibration circuit; and
    circuitry configured to store said second portion of said trim bits in a register as said fine bits responsive to receiving said fine trim signal.

13. The circuit of claim 9 wherein said trim bit register circuit comprises circuitry configured to assert a trim signal responsive to said storing of said coarse and said fine bits.

14. The circuit of claim 8 further comprising:
    a sample clock generating circuit for receiving a system clock signal and dividing said system clock signal into sample clock signals, such that the coarse bit calibration circuit and the fine bit calibration circuit sample data from the integrated circuit at a rate of the sample clock signals, wherein each of said sample clock signals have a lower frequency than said system clock signal.

15. The circuit of claim 14 wherein said coarse bit calibration circuit comprises:
    circuitry configured to select a set of test bits that act as said coarse bits;

circuitry configured to apply said set of test bits to said integrated circuit on each sample clock signal;
circuitry configured to read output of said integrated circuit on each sample clock signal; and
circuitry configured to determine whether said output meet a criteria for each sample clock.

16. The circuit of claim 15 wherein said fine bit calibration circuit comprises circuitry configured to assert a fine trim signal responsive to said determination that said output meets said criteria said predetermined number of times.

17. An apparatus for setting trim bits in an integrated circuit comprising:
means for determining a set of coarse bits wherein said coarse bits are a first portion of said trim bits;
means for determining a set of fine bits wherein said fine bits are a second portion of said trim bits; and
means for storing said set of coarse bits and said set of fine bits in a register for use in said integrated circuit.

18. The apparatus of claim 17 wherein said means for determining said set of coarse bits comprises:
means for receiving a system clock signal; and
means for dividing said system clock signal into sample clock signals wherein each of said sample clock signals have a lower frequency than said system clock signal.

19. The apparatus of claim 17 wherein said means for determining said coarse bits comprises:
means for selecting a set of test bits that act as said coarse bits;
means for applying said set of test bits to said circuit on each sample clock signal;
means for reading output of said circuit on each sample clock signal;
means for determining whether said output meet a criteria for each sample clock; and
means for setting said coarse bits responsive to a determination that said output meets said criteria a predetermined number of said sample clock signals.

20. The apparatus of claim 19 wherein said means for setting said coarse bits further comprises means for asserting a coarse trim signal responsive to said determination that said output meets said criteria said predetermined number of times.

21. The apparatus of claim 19 wherein said means for setting said coarse bits comprises:
means for receiving said coarse trim signal in a register circuit; and
means for storing said test bits as coarse bits responsive to receiving said coarse trim signal.

22. The apparatus of claim 17 wherein said means for determining said set of fine bits comprises:
means for receiving a system clock signal; and
means for dividing said system clock signal into sample clock signals wherein each of said sample clock signals have a lower frequency than said system clock signal.

23. The apparatus of claim 22 wherein said means for determining said set of fine bits further comprises:
means for selecting a set of test bits that act as said fine bits;
means for applying said set of test bits to said circuit on each sample clock signal;
means for reading output of said circuit on each sample clock signal;
means for determining whether said output meet a criteria for each sample clock; and
means for setting said fine bits responsive to a determination that said output meets said criteria a predetermined number of said sample clock signal.

24. The apparatus of claim 23 wherein said means for setting said fine bits further comprises means for asserting a fine trim signal responsive to said determination that said output meets said criteria said predetermined number of times.

* * * * *